(12) United States Patent
Tanaka et al.

(10) Patent No.: US 6,900,517 B2
(45) Date of Patent: May 31, 2005

(54) NON-VOLATILE MEMORY WITH PHASE-CHANGE RECORDING LAYER

(75) Inventors: Hideyuki Tanaka, Hirakata (JP); Kiyoshi Morimoto, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 51 days.

(21) Appl. No.: 10/646,816

(22) Filed: Aug. 25, 2003

(65) Prior Publication Data

US 2004/0051161 A1 Mar. 18, 2004

Related U.S. Application Data (63) Continuation-in-part of application No. PCT/JP03/04066, filed on Mar. 31, 2003.

(30) Foreign Application Priority Data

Apr. 9, 2002 (JP) ......................................... 2002-106167

(51) Int. Cl.$^7$ .............................................. H01L 29/00
(52) U.S. Cl. ......................... 257/532; 257/347; 257/312
(58) Field of Search ................................ 257/532, 347, 257/296, 301, 312

(56) References Cited

U.S. PATENT DOCUMENTS 6,087,674 A   7/2000 Ovshinsky et al.

FOREIGN PATENT DOCUMENTS

| JP | 9-282723 | 10/1997 |
|---|---|---|
| JP | 2001-189431 | 7/2001 |
| WO | WO 98/19350 | 5/1998 |
| WO | WO 98/36446 | 8/1998 |
| WO | WO 99/54128 | 10/1999 |

*Primary Examiner*—Eddie Lee
*Assistant Examiner*—Douglas W. Owens
(74) *Attorney, Agent, or Firm*—McDermott Will & Emery LLP (57) ABSTRACT

A non-volatile memory, which comprises an insulating substrate (11) that has a first electrode (18) that extends through the substrate from the front surface to the rear surface thereof; a second electrode (13) that is formed on one side of the insulating substrate (11); and a recording layer (12) that is clamped between the first electrode (18) and the second electrode (13) and whose resistance value varies when an electric pulse is applied across the first electrode (18) and the second electrode (13); wherein the insulating substrate (11) has a layered structure composed of an organic dielectric thin film (112) and an inorganic dielectric layer (111) that is thinner than the organic dielectric thin film (112); with the recording layer (12) being formed on the side on which the inorganic dielectric layer is formed. Use of this non-volatile memory increases the possible number of data writing cycles while saving power.

11 Claims, 8 Drawing Sheets

NON-VOLATILE MEMORY WITH PHASE-CHANGE RECORDING LAYER

This application is a continuation-in-part of PCT/JP03/04066, filed Mar. 31, 2003.

TECHNICAL FIELD

The present invention relates to a non-volatile memory, and more particularly to a non-volatile memory in which data can be recorded (written) or deleted by using the application of current to control resistance value variations, and to the fabrication method thereof.

BACKGROUND ART

Flash memory, FeRAM, MRAM, phase-change memory, and the like are conventionally known types of non-volatile memory. Recent years have brought about a demand for high-density memories for use in personal digital assistants and the like, and therefore non-volatile memories that employ a phase-change technique are attracting widespread attention and various modifications to them have been proposed (WO, A1 No. 98/19350 (Japanese Unexamined Patent Publication No. 2001-502848), etc.).

For example, Japanese Unexamined Patent Publication No. 1997-282723 discloses an information-recording device in which the writing or deleting of data is performed by bringing an electrically conductive probe into contact with the surface of a recording medium that contains an amorphous semiconductor thin film.

Figure 10:
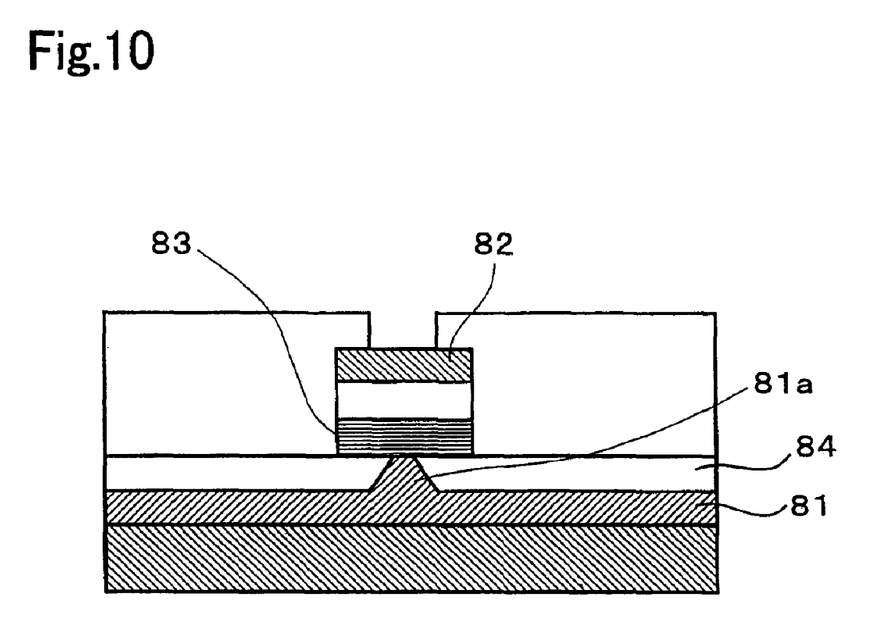
FIG. 10 is a cross-sectional view showing the structure of a non-volatile memory in the prior art.

WO, A1 No. 98/336446 (Japanese Unexamined Patent Publication No. 2001-504279) discloses a phase-change non-volatile memory in which, as shown in FIG. 10, a phase-change material layer 83 is formed between a lower electrode 81 and an upper electrode 82, whereby the phase-change material layer 83 can be charged through the lower electrode 81 and the upper electrode 82. The phase-change material layer 83 comprises a chalcogenide material whose phase is reversibly changeable between an amorphous (non-crystalline) state of high resistance and a crystalline state of low resistance. The material is changed to an amorphous or crystalline state by the application of current, thereby controlling its resistance value. For example, when storing (writing) data, the phase-change material layer 83 is changed from the amorphous state to the crystalline state, lowering the resistance value. When deleting data, the phase-change material layer 83 is changed from the crystalline state to the amorphous state, raising the resistance value. The difference in resistance value is thus read to allow the phase-change material layer 83 to serve as a memory.

In the structure shown in FIG. 10, a joint portion 81a disposed between the lower electrode 81 and the phase-change material layer 83 is isolated by an insulating layer 84. Here, silicon oxide is preferable as the material for the insulating layer 84. However, when the joint portion 81a is insulated using silicon oxide, which is an inorganic dielectric having a relatively high thermal conductivity, a large amount of electric power is needed to write or delete data. This makes it difficult to save power.

On the other hand, when the insulating layer 84 is made of an organic dielectric, this structure not only writes and deletes data with little power consumption but also makes the insulating layer 84 cheaper, lighter in weight, and capable of coping with bending deformation.

However, when using only an organic dielectric as the material for the insulating layer 84, the number of data rewriting cycles is insufficient because the heat withstand temperature of the organic dielectric is lower than the melting point of the phase-change material. In other words, while deleting data, the joint portion 81a that is disposed between the lower electrode 81 and the phase-change material layer 83 momentarily generates heat, which varies the temperature of the phase-change material layer 83 above its melting point (for example, 600° C. or higher). On the contrary, when polyimide, which exhibits excellent heat resistance properties compared to other organic dielectrics, is used as the material for the insulating layer 84, the insulating layer 84 can only withstand temperatures of approximately 500° C., even if the heating is momentary. As a result, the insulating layer 84 near the joint portion 81a decomposes while repeatedly rewriting data. This deteriorates the electrical properties and mechanical stability of the lower electrode 81 and the phase-change material layer 83.

DISCLOSURE OF THE INVENTION

The present invention aims to solve these problems and to provide a non-volatile memory that can increase the possible number of data rewriting cycles while lowering power consumption, and the fabrication method thereof.

The objects of the present invention are achieved by a non-volatile memory comprising an insulating substrate having a first electrode extending through the substrate from the front surface to the rear surface thereof; a second electrode formed on one side of the insulating substrate; and a recording layer that is clamped between the first electrode and the second electrode and whose resistance value varies when an electric pulse is applied across the first electrode and the second electrode; the insulating substrate having a layered structure composed of an organic dielectric thin film and an inorganic dielectric layer that is thinner than the organic dielectric thin film, with the recording layer being formed on the side on which the inorganic dielectric layer is formed.

This non-volatile memory can be fabricated by a method for fabricating, for example, the non-volatile memory of claim 1, which comprises the step of forming an inorganic dielectric layer by depositing an inorganic dielectric on one surface of the organic dielectric thin film in which fine pores have been formed, the step of covering one end of the pores with a recording layer by depositing a recording layer and a second electrode, in this order, on the surface of the inorganic dielectric layer, and the step of forming a first electrode onto each pore.

The above-described non-volatile memory can be suitably used in an information-recording device or a display device having the following structures.

(1) An information-recording device that comprises a non-volatile memory, a first clamping member and a second clamping member that clamp the non-volatile memory therebetween, and a first elastic member that lies between the non-volatile memory and the first clamping member;

the non-volatile memory comprising an insulating substrate having a first electrode extending through the substrate from the front surface to the rear surface thereof, a second electrode formed on one side of the insulating substrate, and a recording layer that is clamped between the first electrode and the second electrode and whose resistance value varies when an electric pulse is applied across the first electrode and the second electrode;

the insulating substrate having a layered structure composed of an organic dielectric thin film and an inorganic dielectric layer that is thinner than the organic dielectric thin film, with the recording layer being formed on the side on which the inorganic dielectric layer is formed, and the first electrode being exposed on the side on which the organic dielectric layer is formed;

the first electrode and the second electrode having a plurality of memory cells that are formed in the regions where the first electrode and the second electrode overlay each other as seen in a plan view, and the second clamping member being provided with a plurality of first conductive materials on the clamping surface that are electrically connected to the first electrodes that correspond to the memory cells; and the memory cells further being provided with a switching elements that control the application of current to the memory cells.

(2) An information-recording device according to (1), wherein the first clamping member comprises a clamping surface with a second conductive material that is electrically connected to the second electrode and has a second elastic member therebetween.

(3) An information-recording device that comprises a non-volatile memory, a first clamping member and a second clamping member that clamp the non-volatile memory therebetween;

the non-volatile memory having two submemories each containing an insulating substrate having a first electrode that extends through the substrate from the front surface to the rear surface thereof, a second electrode that is formed on one side of the insulating substrate, and a recording layer that is clamped between the first electrode and the second electrode and whose resistance value is changeable by applying an electric pulse across the first electrode and the second electrode, wherein the second electrodes of the two submemories face each other with a first elastic member in between;

the insulating substrate having a layered structure composed of an organic dielectric thin film and an inorganic dielectric layer that is thinner than the organic dielectric thin film, with the first electrode being exposed on the side where the organic dielectric layer is formed;

the first electrode and the second electrode having a plurality of memory cells that are formed in the regions where the first electrode and the second electrode overlay as seen in a plan view, and the first clamping member and the second clamping member being provided with a plurality of first conductive materials on the clamping surface that are electrically connected to the first electrodes that correspond to memory cells and that face the clamping surface; and the memory cells further being provided with switching elements that control the application of current to the memory cells.

(4) An information-recording device according to (3), wherein the first clamping member and the second clamping member comprise, on the clamping surface, a second conductive material that is electrically connected to the second electrode that faces the clamping surface, with a second elastic member therebetween.

(5) An information-recording device that comprises a non-volatile memory and an electrically conductive probe that is movable relative to the non-volatile memory;

the non-volatile memory having an insulating substrate that contains a first electrode that extends through the substrate from the front surface to the rear surface thereof, a second electrode that is formed on one side of the insulating substrate, and a recording layer that is clamped between the first electrode and the second electrode and whose resistance value is changeable by applying an electric pulse across the first electrode and the second electrode;

the insulating substrate having a layered structure composed of an organic dielectric thin film and an inorganic dielectric layer that is thinner than the organic dielectric thin film, with the first electrode being exposed on the side where the organic dielectric layer is formed; and the first electrode and the second electrode having a plurality of memory cells that are formed in the regions where the first electrode and the second electrode overlay each other as seen in a plan view, wherein the electrically conductive probe is capable of supplying current to the recording layer by being brought into contact with the first electrode of a predetermined memory cell.

(6) A display device comprising a paper display that is provided with a non-volatile memory;

the non-volatile memory having an insulating substrate that contains a first electrode that extends through the substrate from the front surface to the rear surface thereof, a second electrode that is formed on one side of the insulating substrate, and a recording layer that is clamped between the first electrode and the second electrode and whose resistance value is changeable by applying an electric pulse across the first electrode and the second electrode; and the insulating substrate having a layered structure composed of an organic dielectric thin film and an inorganic dielectric layer that is thinner than the organic dielectric thin film, with the recording layer being formed on the side where the inorganic dielectric layer is formed.

BEST MODE FOR CARRYING OUT THE INVENTION

Embodiments of the present invention will be described below with reference to the accompanying drawings.

(Non-volatile Memories)

Figure 1:
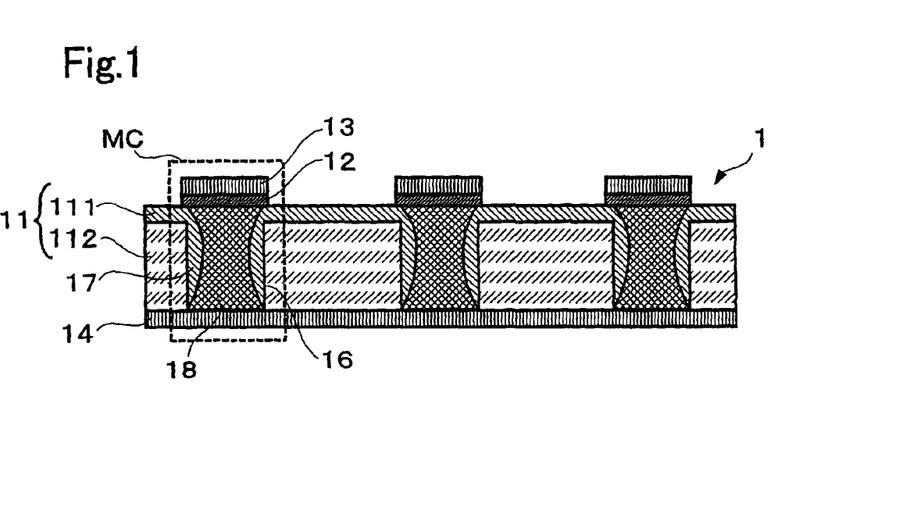
FIG. 1 is a cross-sectional view showing the main parts of non-volatile memory according to one embodiment of the present invention.

FIG. 1 is a cross-sectional view showing the main parts of a non-volatile memory according to one embodiment of the present invention. As shown in FIG. 1, a non-volatile memory 1 comprises an insulating substrate 11 that is formed by laminating an inorganic dielectric layer 111 and an organic dielectric thin film 112, recording layers 12 and upper electrodes 13 that are formed on the inorganic dielectric layer 111 side of the insulating substrate 11, and a lower electrode 14 that is formed on the organic dielectric thin film 112 side of the insulating substrate 11.

The inorganic dielectric layer 111 is formed of an insulator that is inert to the recording layer 12 during heat generation, and can be an oxide film of SiOx and the like, a nitride film of SiNx and the like, as well as $SiO_2$—ZnS, $SiO_2$—ZnSe, etc. For example, when the inorganic dielectric layer 111 is made of a mixed layer containing $SiO_2$ and ZnS in the ratio of $SiO_2$:ZnS=approximately 0.2:approximately 0.8, it is possible to make the layer that is deposited on the inorganic dielectric layer 111 difficult to peel off.

Examples of materials for the organic dielectric thin film 112 include polyimide, polycarbonate, and like insulative polymers. The organic dielectric thin film 112 is thicker than the inorganic dielectric layer 111, and therefore it is possible to reduce the power required to write or delete data, and to make the substrate 11 readily deformable by elastic bending.

The recording layer 12, which exhibits 2 or more stable conditions, is made of a phase-change material that is reversibly switchable between the phases and that allows control of variations in its resistance value attributable to the application of current. Specific examples of usable materials include chalcogenide based materials, such as $Ge_2Sb_2Te_5$, $Ge_1Sb_2Te_4$ and like Ge—Sb—Te compounds, $Ag_5In_5Sb_{70}Te_{20}$ and like Ag—In—Sb—Te compounds, $Te_{80}Sb_5As_{15}$ and like Te—Sb—As compounds, $Te_{81}Ge_{15}Sb_2S_2$ and like Te—Ge—Sb—S compounds, $Te_{93}Ge_5As_2$ and like Te—Ge—As compounds, $Te_{80}Ge_5Sn_{15}$ and like Te—Ge—Sn compounds, $Te_{60}Ge_4Sn_{11}Au_{25}$ and like Te—Ge—Sn—Au compounds, GeTe compounds, etc. The recording layer 12, which is clamped between an intermediate electrode (first electrode) 18 that will be described later and an upper electrode 13 (second electrode), is electrically conductive.

The upper electrode 13 and the lower electrode 14 are made of metal materials, such as gold (Au) or the like. A plurality of upper electrodes 13 and lower electrodes 14 are formed into a striped pattern with equal intervals therebetween, in which the longitudinal directions of the upper electrodes 13 and the lower electrodes 14 intersect at right angles as seen in a plan view. The regions in which the upper electrodes 13 and the lower electrodes 14 overlay each other as seen in a plan view compose each memory cell MC. Each memory cell MC can be structured so as to be electrically separated by using a selective transistor, diode, or the like in order to prevent mutual interference therebetween. The width of the belt-like portions of the upper electrodes 13 and the lower electrodes 14 that form a striped pattern is selected depending on the design, and is, for example, not less than 15 μm but not more than 100 μm. Of course, it is possible to form belt-like portions having a width smaller than the above range by employing lithography or FIB (focused ion beam) using light, an electron beam, etc. It is preferable that the intervals between the belt-like portions be not less than twice and not greater than ten times the width of the belt-like portions.

On the positions corresponding to each memory cell MC, the insulating substrate 11 comprises a large number of fine pores 16 that extend through the substrate from the front surface to the rear surface thereof. A portion of the inorganic dielectric layer 111 enters in and adheres to the inner wall surface of the pore 16, forming a ring-shaped heat-resistant protective film 17 that is continuously connected to the inorganic dielectric layer 111. In the pore 16, which is covered by a lower electrode 14 on its lower end, an intermediate electrode 18 that is made of, for example, rhodium (Rh) is filled. The recording layer 12 and the lower electrode 14 are electrically connected by this intermediate electrode 18. In the memory cell MC, the upper portion of the intermediate electrode 18 is covered by the upper electrode 13, and the intermediate electrode 18 is electrically connected to the upper electrode 13 via the recording layer 12.

In the thus constructed non-volatile memory 1, data can be written to, read or deleted from a predetermined memory cell MC by selecting the upper electrode 13 and the lower electrode 14 corresponding to the memory cell MC and applying a suitable electric pulse across the selected electrodes. More specifically, to write data, an electric pulse is applied to the electrodes with a predetermined voltage to produce Joule heat, thereby changing the recording layer 12 from an amorphous state to a crystalline state and lowering the resistance value thereof. To delete data, on the other hand, an electric pulse having a pulse width shorter than that for writing is applied to rapidly cool the high temperature of the recording layer 12, thereby changing the layer 12 from a crystalline state to an amorphous state and raising the resistance value thereof. To read data, a voltage lower than that for writing or deleting is applied to detect the current value that is based on the resistance value variation.

In the present embodiment, the recording layer 12 is formed on the substrate 11 on the side where the inorganic dielectric layer 111 is formed. Therefore, it is possible to restrain the heat that is generated around the joint portion between the recording layer 12 and the intermediate electrode 18 due to the application of current for recording or deleting data from being transmitted to the organic dielectric thin film 112. Therefore, it is possible to prevent decomposition of the organic dielectric thin film 112 due to the rise of temperature. This prevents deterioration of the recording layer 12 and intermediate electrode 18, and increases the number of possible data recording or deleting cycles to or from the memory cell MC. Furthermore, because the heat-resistant protective film 17 that is made of an inorganic dielectric is formed on the inner wall surface of the pore 16, it is possible to restrain the heat that is generated around the joint portion between the recording layer 12 and the intermediate electrode 18 from being transmitted to the organic dielectric thin film 112.

If the inorganic dielectric layer 111 is too thin, the thermal protection effect for the organic dielectric thin film 112 becomes insufficient. On the other hand, if the organic dielectric thin film 112 is too thick, effects such as the reduction in power consumption that are achieved by the use of the organic dielectric thin film 112 become insufficient. Therefore, it is preferable that the thickness of the inorganic dielectric layer 111 be not less than 2 nm but not more than 50 nm. It is preferable that the thickness of the organic dielectric thin film 112 be not less than 100 nm but not more than 10,000 nm.

Figure 2:
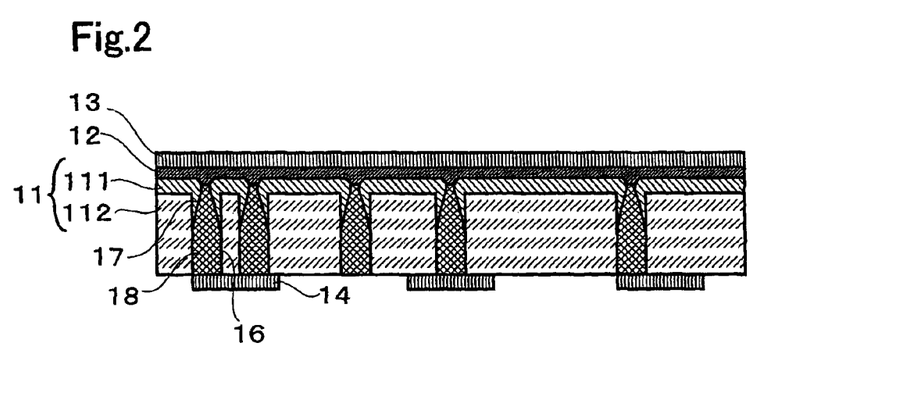
FIG. 2 is a cross-sectional view showing the main parts of non-volatile memory according to another embodiment of the present invention.
Figure 3:
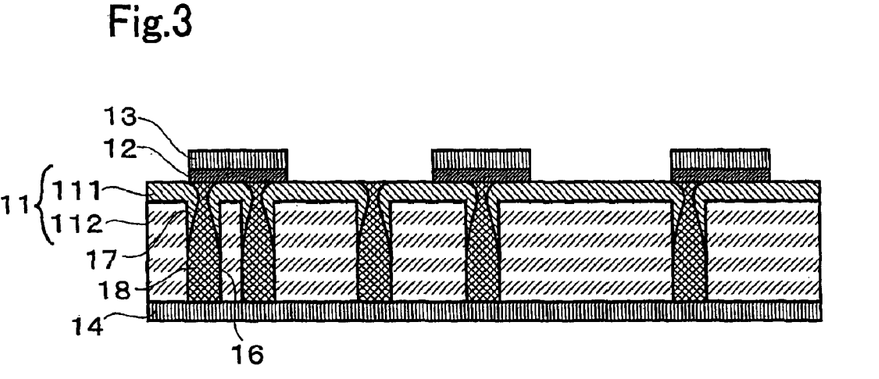
FIG. 3 is a cross-sectional view showing the main parts of non-volatile memory according to still another embodiment of the present invention.

The structure of the non-volatile memory 1 is not limited to the above-described structure, and several modifications can be added. For example, as shown in FIG. 2 or FIG. 3, it is possible to dispose one or more intermediate electrodes 18 on each region of the memory cell MC by using a substrate 11 having a large number of fine pores 1b randomly arranged therein. This eases the limitations on the positions in which the recording layer 12 can be formed, increasing the design flexibility. It is also possible to enhance the insulation property between the memory cells MC by forming a separate upper electrode 13 and recording layer 12 for each memory cell MC. Instead of disposing the upper electrodes 13 and lower electrodes 14 into a striped pattern, it is also possible, for example, to form the upper electrode 13 on one entire surface of the substrate and dispose the lower electrodes 14 in a matrix.

In the present embodiment, the recording layer 12 can be accessed by disposing the upper electrode 13 and the lower electrode 14 on the front and rear surfaces of the insulating substrate 11; however, as described later, if the recording layer is structured so as to be clamped between the intermediate electrode (first electrode) and the upper electrode (second electrode), the lower electrode is not absolutely necessary.

(Method for Fabricating a Non-volatile Memory)

Hereunder, a method for fabricating a non-volatile memory will be explained by taking the non-volatile memory shown in FIG. 2 as an example.

Figure 4:
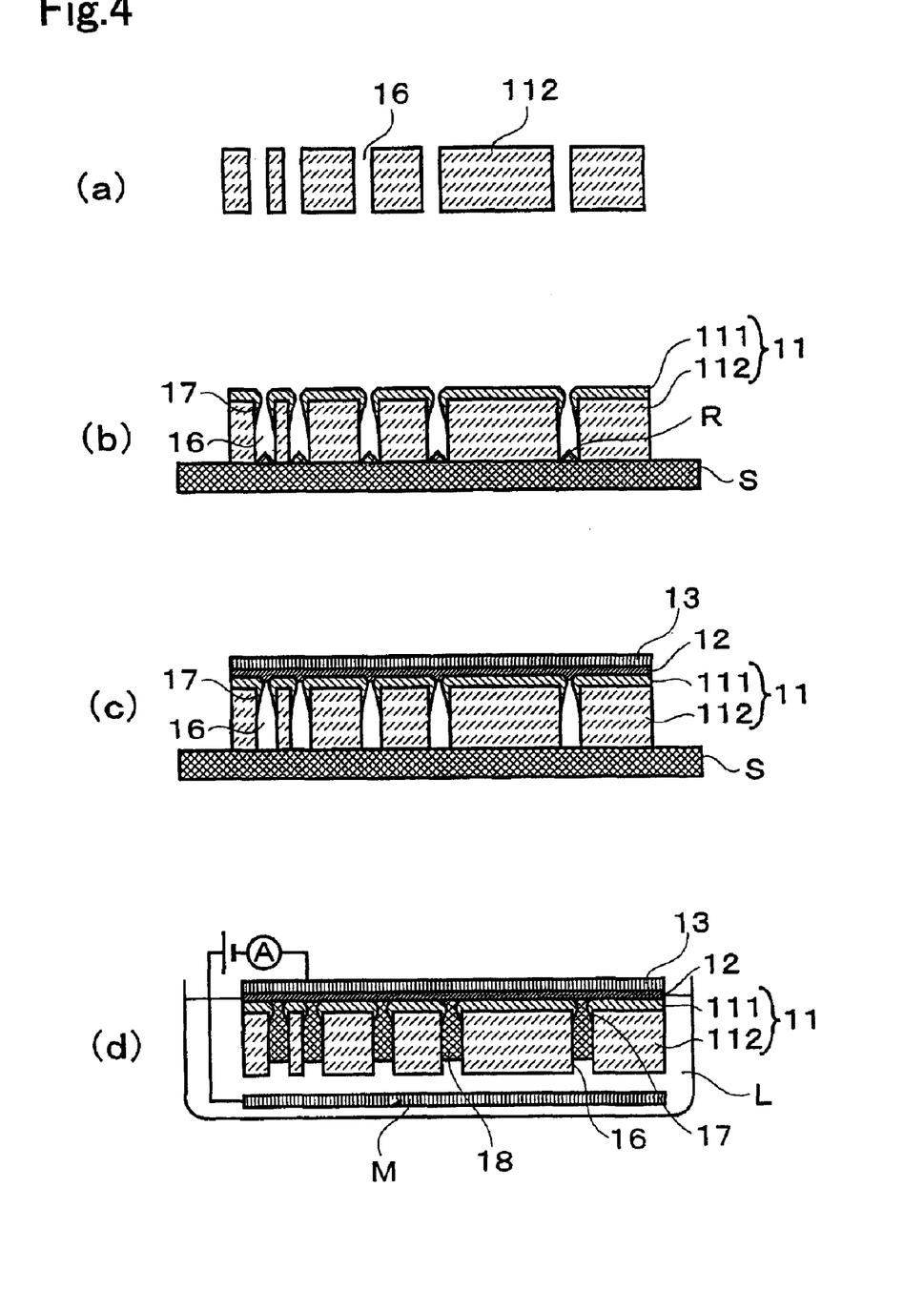
FIG. 4 is a cross-sectional view illustrating a fabrication process for a non-volatile memory according to one embodiment of the present invention.

First, as shown in FIG. 4(a), a 6-μm-thick organic dielectric thin film 112 made of polycarbonate was prepared, in which a large number of fine pores 16 having a diameter of 100 nm were formed substantially perpendicular to the surface thereof. Methods for forming a large number of fine pores in a film are disclosed in, for example, the specifications of U.S. Pat. No. 6,060,743 (Japanese Unexamined Patent Publication No. 1999-40809) and Japanese Unexamined Patent Publication No. 1999-170378. In the present embodiment, after irradiating the surface of the organic dielectric thin film with an ion beam held perpendicular to the surface to form an ion track, the ion track was selectively etched by dipping the film into an etching solution to randomly form a large number of fine pores. Such a forming method does not employ lithography techniques, and therefore it is possible to obtain fine pores at low cost even when the diameter of the pore is as small as approximately 100 nm. It is preferable that, by adjusting the etching time or the like, the diameter of the fine pores 16 be controlled to a predetermined value to obtain a preferable aspect ratio, which will be described later.

Then, as shown in FIG. 4(b), the organic dielectric thin film 112 was placed on a susceptor S of a sputtering device, and $SiO_2$, which is an inorganic dielectric, was deposited thereon to form an inorganic dielectric layer 111 on the organic dielectric thin film 112, thus obtaining an insulating substrate 11. The amount of inorganic dielectric deposited was such that the fine pores 16 were not completely closed. In the present embodiment, the deposition of $SiO_2$ was stopped when the diameter of the openings of the fine pores 16 narrowed from 100 nm to 50 nm. At this time, the thickness of the inorganic dielectric layer 111 was approximately 30 nm.

The condition of the inorganic dielectric that is deposited on the organic dielectric thin film 112 varies depending on the aspect ratio of the pores 16 (the aspect ratio is obtained by dividing the height of the pore 16 by the diameter of the pore 16). When the aspect ratio is not less than 10 but not more than 100 as in the present embodiment, an inorganic dielectric will be deposited on the organic dielectric thin film 112 and, at the same time, will adhere to the inner wall surface of the pore 16 around the opening thereof, forming a ring-like heat-resistant protective film 17, as shown in FIG. 4(b). When the aspect ratio of the pore 16 is not less than 10 but not more than 100, the thickness of the heat-resistant protective film 17 inside the pore 16 becomes thinner toward the lower portion (in FIG. 1, in the direction from the upper electrode (second electrode) 113 toward the intermediate electrode (first electrode) 118 and the lower electrode 14). In other words, there are some portions in which the inside diameter of the pore 16 becomes larger in the direction from the upper portion to the lower portion due to the heat-resistant protective film 17 that is formed around the inner wall surface thereof.

This heat-resistant protective film 17 can effectively restrain the heat that is generated around the interface between the recording layer 12 and the intermediate electrode 18 due to application of current from being transmitted to the organic dielectric thin film 112. Furthermore, the formation of a narrow current-carrying part of the intermediate electrode 18 due to the heat-resistant protective film 17 increases the current density, making it possible to reduce the power consumption of the product.

On the other hand, if the aspect ratio of the fine pore 16 is one or more and less than 10, the inorganic dielectric can easily enter the fine pores 16, and therefore the ring-like heat-resistant protective film 17 as shown in FIG. 4(b) can be formed not only around the openings of the fine pores 16 but also on the entire inner wall surfaces of the fine pores 16 in such a manner that the thickness of the film becomes substantially uniform. In other words, when the aspect ratio of the fine pore 16 is one or more and less than 10, regardless of the presence of the heat-resistant protective film 17 therein, the inside diameter of the fine pore 16 becomes substantially uniform from the top to the bottom thereof.

In this case, the above-described narrow current-carrying part is not formed in the intermediate electrode 18; however, the thermal protective effect of the heat-resistant protective film on the organic dielectric thin film 112 can be enhanced.

In such a process for depositing an inorganic dielectric, a small amount of the inorganic dielectric enters the fine pores 16 and is deposited on the susceptor S. When the organic dielectric thin film 112 is removed from the susceptor S, some of the inorganic dielectric remains in the fine pores 16 as residue R. Therefore, after forming the inorganic dielectric layer 111, it is necessary to eliminate the residue R by removing the organic dielectric thin film 112 from the susceptor S and supplying gas into the fine pores 16 from the inorganic dielectric layer 111 side. In this case, it is necessary to remount the organic dielectric thin film 112 on the susceptor S, which makes the process complicated.

Figure 5:
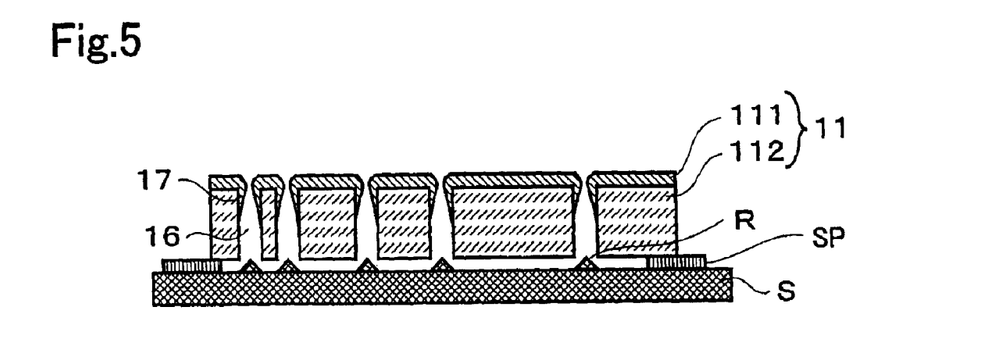
FIG. 5 is a cross-sectional view illustrating a fabrication process for a non-volatile memory according to another embodiment of the present invention.

Therefore, in the process for forming the inorganic dielectric layer 111, instead of directly attaching the organic dielectric thin film 112 onto the surface of the susceptor S, it is possible to form a gap between the organic dielectric thin film 112 and the susceptor S by providing a spacer SP therebetween as shown in FIG. 5. The inorganic dielectric that has entered the fine pores 16 thus does not remain inside the fine pores 16 and reaches the surface of the susceptor S. This eliminates the need to remove the organic dielectric thin film 112 from the susceptor S after depositing the inorganic dielectric, and thereby enables the subsequent process to be promptly started.

Next, as shown in FIG. 4(c), a recording layer 12 was formed by sputtering a memory material made of $Ge_2Sb_2Te_5$ on the inorganic dielectric layer 111 side of the substrate using a metal mask, and then an upper electrode 13 was formed on one entire surface of the substrate by further sputtering Au on the recording layer. As a memory material, for example, the use of $GeSb_2Te_4$ having various chemical constituent ratios is effective for extending the service life of the product because the melting point of the memory material becomes relatively low. The openings of the fine pores 16 in which the diameters have been narrowed by the formation of the inorganic dielectric layer 111 thus become covered with the recording layer 12 that has been formed by depositing the memory material.

Intermediate electrodes were then formed in the fine pores 16. Formation of the intermediate electrodes can be performed by employing a sputtering method, remote sputtering method, electroplating method, or other method; however, in the present embodiment, the electroplating method was employed. As shown in FIG. 4(d), a plating solution L was prepared by dissolving the positive ions of the plating metal in an acidic solution, wherein a metal plate M composed of Au or the like, which is insoluble in the plating solution L, formed a positive electrode, and the recording layer 12, whose surface was exposed to the inside of the pores 16 formed a negative electrode. A power source was connected to the electrodes and the negative electrode was thereby electroplated. It is preferable that the upper electrode 13 and the conductive plate that is composed of the metal plate M, etc., be parallel as shown in FIG. 4(d). This will allow the insides of the fine pores 16 to be gradually filled with the plating metal, and the plating to be stopped when the insides of the fine pores 16 are completely filled, thereby producing the intermediate electrodes 18. Rh, Ru, Pt, Au, Cu, and the like are preferable as plating metals. Materials such as Cu and the like that are usable for the multilayer interconnection of ULSIs, in particular, are easily obtainable at low cost.

The timing for stopping the electroplating can be determined by measuring the relationship between the quantity of the plated metal and the plating time in advance, and estimating the time necessary for the plating metal to fill the fine pores 16. Alternatively, it is also possible to determine the timing for stopping the plating by utilizing the fact that the plated surface changes color depending on the amount of the plated metal. In other words, immediately before the fine pores 16 are filled with the plating metal, the visible part of the plated surface appears black; however, when the insides of the fine pores 16 are completely filled with the plating metal and the plated surface extends along the surface of the insulating substrate 11, the plated surface turns from black to white. Therefore, plating can be stopped when the plated surface turns white. Furthermore, in addition to the color change of the plated surface, it is also possible to determine the timing for stopping the plating from the fact that when plating is done at a constant voltage, a kink appears in the time-related change in the current value (or in the time-related change in the voltage value when plating is done at a constant current).

Lastly, the formation of a non-volatile memory as shown in FIG. 2 is completed by forming lower electrodes 14 in the form of a matrix by sputtering Au on the rear surface of the insulating substrate 11 (on the organic dielectric thin film 112 side) using a metal mask. The number of data rewiring cycles was measured for this non-volatile memory, and it was a minimum of $10^4$, resulting in a satisfactory writing life time.

In a structure as shown in FIG. 3, the intermediate electrode 18 is formed by plating the lower electrode 14, which has been formed in advance, and then forming the recording layer 12 and the upper electrode 13. The electroplating can be done to the lower electrode 14, which is formed of metal, and this is advantageous in that it enables a high level of plating control.

(Information-recording Devices)

Figure 6:
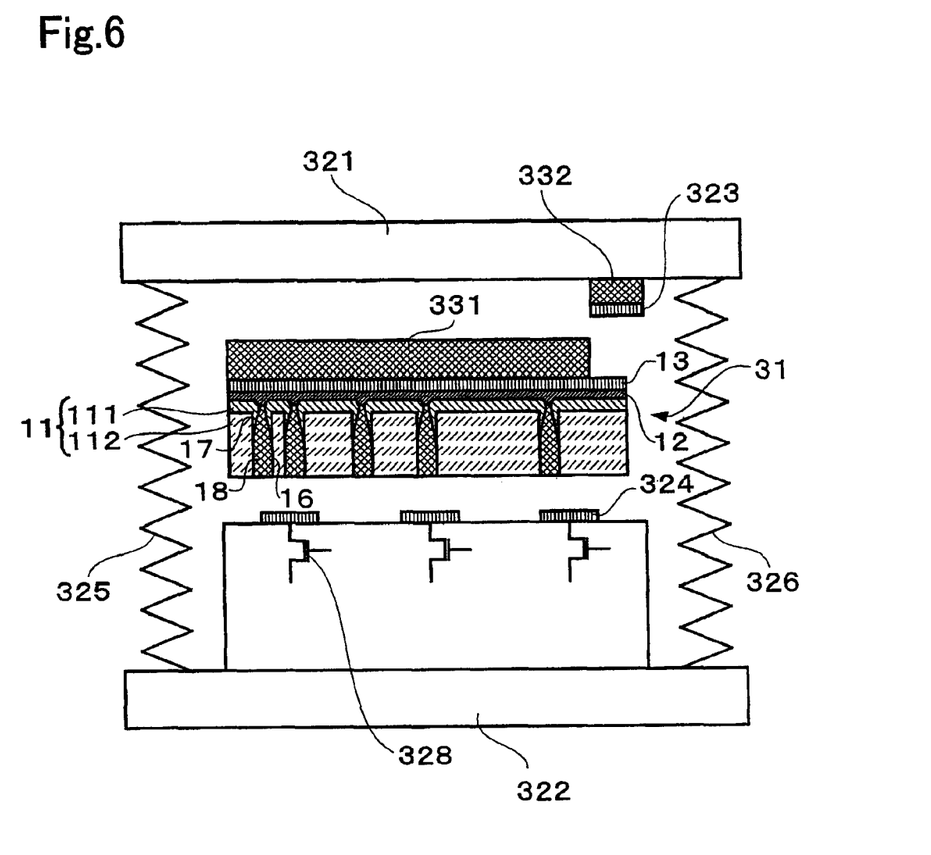
FIG. 6 is a cross-sectional view schematically illustrating an information-recording device according to one embodiment of the present invention.

FIG. 6 is a cross-sectional view schematically illustrating an information-recording device according to one embodiment of the present invention. The information-recording device shown in FIG. 6 comprises a non-volatile memory 31, a pair of clamping members that clamps the non-volatile memory 31 therebetween (a first clamping member 321 and a second clamping member 322), and elastic members (a first elastic member 331 and a second elastic member 332) that are made of rubber or the like and held between the non-volatile memory 31 and the first clamping member 321. The first elastic member 331 is fixed on the surface of the upper electrode 13 in such a manner that a portion of the upper electrode 13 of the non-volatile memory 31 is exposed. It is also possible to attach a label describing the characteristics (the name of the company that manufactured the memory, the content of the recorded data, etc.) of the non-volatile memory 31 on the surface of the first elastic member 331.

The non-volatile memory 31 has a structure in which a lower electrode 14 is omitted from the non-volatile memory 1 shown in FIG. 2, but in other respects, the structure thereof is the same as the non-volatile memory 1 shown in FIG. 2. Therefore, the same reference numbers are used for the same constituent components thereof and a detailed explanation is omitted.

The first clamping member 321 and the second clamping member 322 are composed of a hard plastic, etc., having high rigidity, and each comprises a second conductive material 323 and a first conductive material 324 on its clamping surface, respectively. Between the pair of the clamping members 321 and 322, spring members 325 and 326 that serve as a biasing means for holding the non-volatile memory 31 therebetween.

The second conductive material 323 is mounted on a clamping surface of the first clamping member 321 with the second elastic member 332 therebetween. The second conductive material 323 is designed so as to be electrically connectable to the entire exposed portion of the upper electrode 13. Furthermore, the first conductive materials 324 are formed in a matrix and mounted on the clamping surface of the second clamping member 322, and are electrically connected to the intermediate electrodes 18. To the first conductive material 324, a switching element 328 is connected so that it can control the ON/OFF of the application of current to the recording layer 12 via the first conductive material 324. In the present embodiment, the switching element 328 is formed from a selective transistor that is made of Si, etc.; however, it is also possible to use a pn junction diode, a Schottky diode and the like.

With information-recording device structured in this way, from the condition shown in FIG. 6, the second conductive material 323 comes in contact with the upper electrode 13 and the first conductive material 324 comes in contact with the intermediate electrode 18 by the action of the spring members 325 and 326, and the non-volatile memory 31 is thereby clamped between the pair of clamping members 321 and 322.

Because the first elastic member 331 and the second elastic member 332 lie between the first clamping member 321 and the non-volatile memory 31, the non-volatile memory 31 and the second clamping member 322 can uniformly contact each other due to the pressure generated by the elastic members, and the electric contact between the first conductive material 324 and the intermediate electrode 18 is thereby reliably ensured. In addition, in the present embodiment, because an organic dielectric thin film 112 that is easily deformed by elastic bending is disposed so as to contact the clamping surface of the second clamping member 322, the contact between the non-volatile memory 31 and the second clamping member 322 can be further improved. It is also possible to dispose the first elastic member 331 on the first clamping member 321 instead of on the non-volatile memory 31. In this case, the first elastic member 331 and the second elastic member 332 can be configured into a single-unit structure.

Access to a memory cell can be performed by turning the switching element 328 that corresponds to the selected memory cell to an ON state. Data can be written by supplying electric power to the recording layer 12 of the accessed memory cell to generate heat, thereby changing the recording layer from an amorphous state to a crystalline state, and lowering the resistance thereof. Data can be read by measuring the resistance value of the recording layer 12 of the accessed memory cell. Data can be deleted by rapidly cooling the recording layer 12 of the accessed memory cell that has been heated by applying electric power, thereby changing the recording layer from a crystalline state to an amorphous state to increase the resistance thereof.

Figure 7:
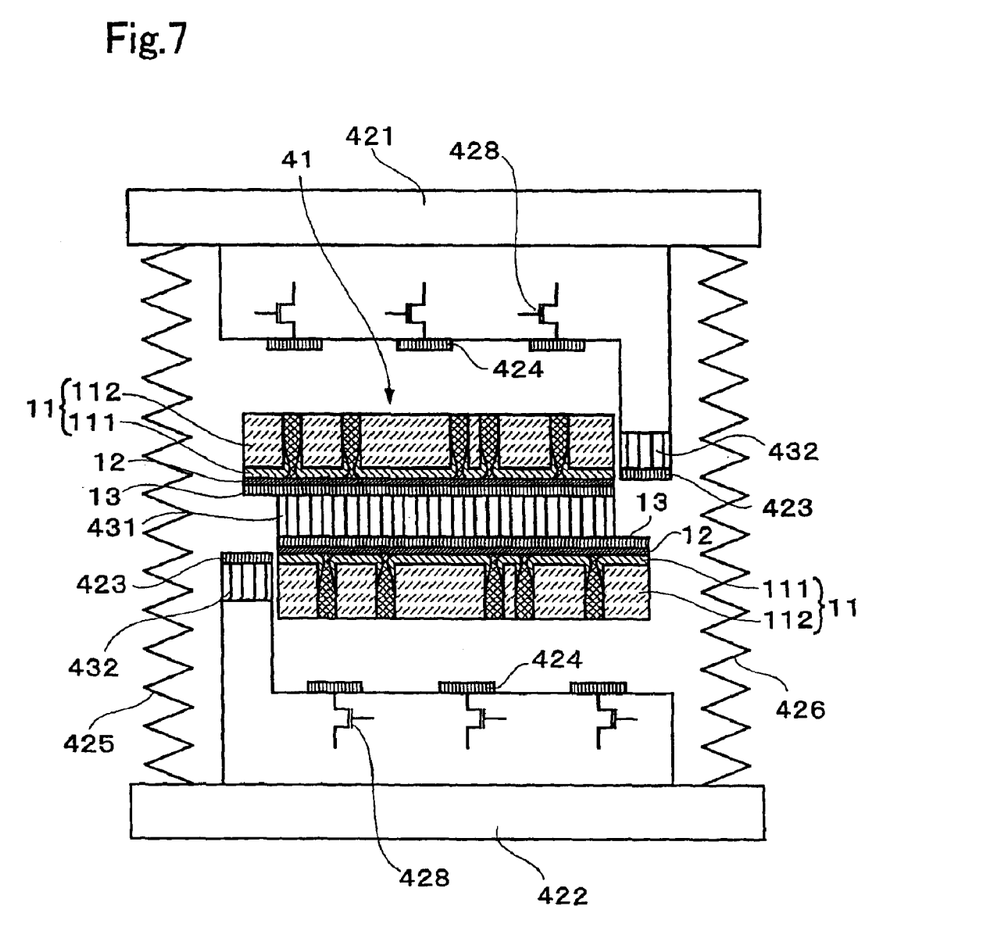
FIG. 7 is a cross-sectional view schematically illustrating an information-recording device according to another embodiment of the present invention.

The specific structure of the information-recording device is not limited to the above-described embodiment, and various modifications can be added. For example, the information-recording device as shown in FIG. 7 comprises a non-volatile memory 41, a pair of clamping members (a first clamping member 421 and a second clamping member 422) that clamp the non-volatile memory 41 therebetween, and elastic members (a first elastic member 431 and a second elastic member 432) made of rubber, flexible plastic, etc., which are held between the non-volatile memory 41 and the first clamping member 421.

The non-volatile memory 41 is formed by using the non-volatile memory 31 of FIG. 6 as a submemory, and uniting two submemories in such a manner that the upper electrodes 13 of the submemories face each other with a first elastic member 431 therebetween, wherein a portion of the upper electrode 13 of each submemory is exposed.

The first clamping member 421 and the second clamping member 422 are made of a hard plastic, etc., having high rigidity. Both the second conductive material 423 and the first conductive material 424 are disposed on each clamping surface. Spring members 425 and 426, which serve as biasing means for clamping the non-volatile memory 41, are disposed between the pair of clamping members 421 and 422.

The second conductive materials 423 are disposed on the clamping surfaces of the clamping members 421 and 422 with the second elastic members 432 disposed therebetween so as to be electrically connectable to the exposed portions of the upper electrodes 13. Furthermore, a plurality of first conductive materials 424 are mounted on the clamping surfaces of the clamping members 421 and 422 by being formed into a matrix and are electrically connectable to the intermediate electrodes 18. A switching element 428 is connected to the first conductive material 424 so that application of current to the recording layer 12 can be turned ON/OFF via the first conductive material 424. In the present embodiment, the switching element 428 is formed from a selective transistor made of Si or the like; however, it is also possible to use pn junction diodes, Schottky diodes, etc.

An information-recording device structured in this way can also achieve the same effects as the information-recording device of FIG. 6. Furthermore, since an information-recording device structured in this way can obtain twice the memory capacity of the information-recording device of FIG. 6, it can meet demands for increased memory capacity.

In the above-described information-recording device, access to a predetermined memory cell can be achieved by methods other than that described above, wherein a switching element is used. For example, in a non-volatile memory as shown in FIG. 2, a memory cell can be accessed by using an electrically conductive probe.

Figure 8:
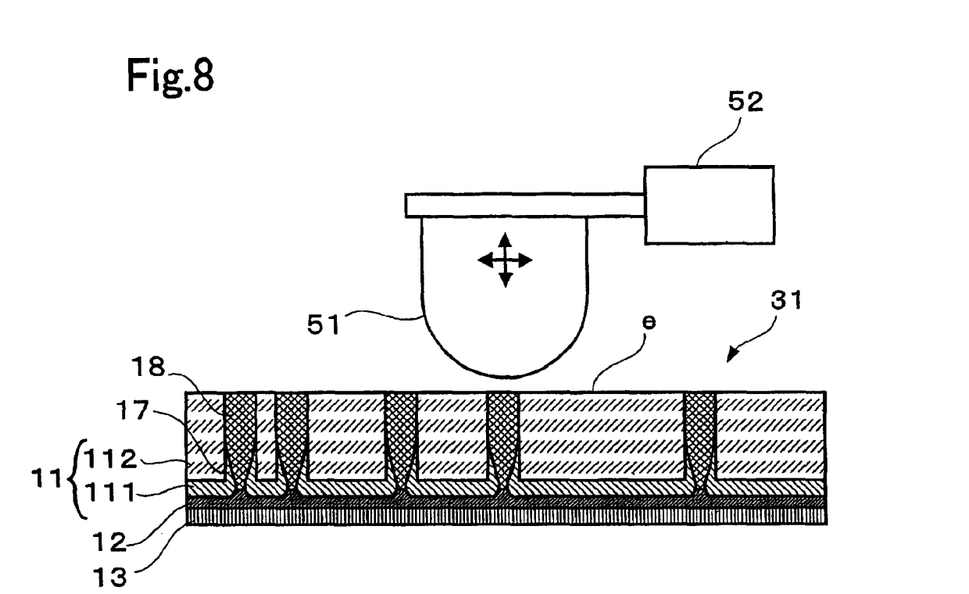
FIG. 8 is a cross-sectional view schematically illustrating an information-recording device according to still another embodiment of the present invention.

In FIG. 8, an electrically conductive probe 51 is structured so as to be movable in the vertical and horizontal directions by a transferring mechanism 52. In order to access a memory cell, first, the electrically conductive probe 51 is brought near to the exposed surface e of the intermediate electrodes 18 to such a degree that the probe does not come into contact with the exposed surface e and is transferred to the predetermined memory cell in parallel to the exposed surface e. Then, the electrically conductive probe 51 is brought into contact with the exposed surface e, and, after writing, reading, or deleting data, the electrically conductive probe 51 is separated from the exposed surface e. In the present embodiment, the electrically conductive probe 51 comes into contact with the surface of the organic dielectric thin film 112 which deforms easily by elastic bending, and therefore increasing the contact of the electrically conductive probe 51 and ensuring reliable electrical contact thereof.

Instead of configuring the electrically conductive probe 51 so as to be movable, it is also possible to employ a structure in which the non-volatile memory 31 is movable (including rotary movement) while the electrically conductive probe 51 is fixed, or one in which both the electrically conductive probe 51 and the non-volatile memory 31 are movable. Alternatively, it is possible to form a plurality of electrically conductive probes 51 in such a manner that each electrically conductive probe 51 is independently controllable.

(Display Devices)

The power consumption of the non-volatile memories according to the foregoing embodiments can be reduced when writing or deleting data, therefore making them useful for various applications. These memories are usable, for example, for a paper display as shown in FIG. 9.

Figure 9:
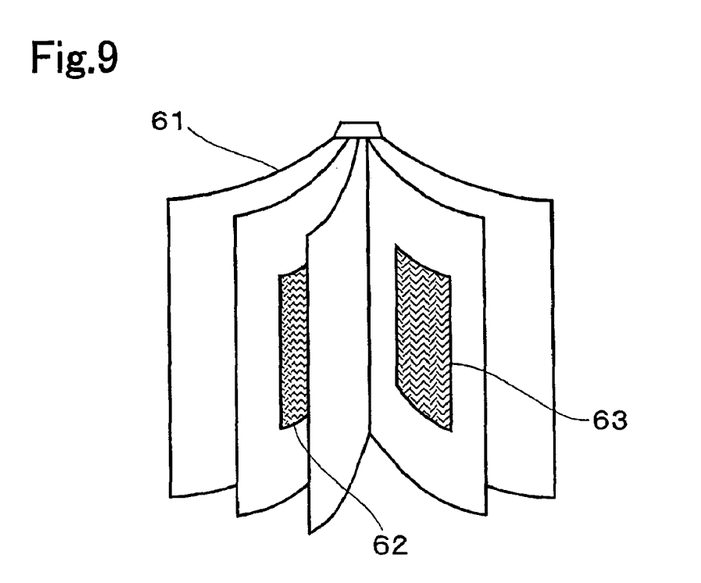
FIG. 9 is a perspective view schematically illustrating a display device according to one embodiment of the present invention.

FIG. 9 shows a paper display 61 comprising a non-volatile memory 62 disposed on the rear surface thereof, a display 63 disposed on the front surface thereof for displaying characters and images, wherein a plurality of paper displays are bound together. The paper display 61 can be fabricated using known techniques, such as that disclosed by Japanese Unexamined Patent Publication No. 1999-502950. The non-volatile memory 62 shown in FIG. 1 can be employed. The characters and images to be shown on the paper display 61 can be stored in the non-volatile memory 62 as data, then transferred automatically or manually to the display 63, in order to change the displayed characters or images.

In this structure, the data to be displayed is stored in a non-volatile memory that is able to conform to the changing shape of the foldable and curvable paper display. Therefore, it allows characters or images to be changed without impairing the ability of the paper display to change shape, and the pages can be turned without any unnatural feeling.

The non-volatile memory 62 can be configured so as to easily removable from the paper display 61, thereby allowing the removed non-volatile memory 62 to be mounted to a data playback device (not shown) and the digital data for the recorded content and display content to be imported into a computer and used.

INDUSTRIAL APPLICABILITY

As described above, the present invention can provide a non-volatile memory that can increase the maximum possible number of data writing cycles while lowering power consumption.

What is claimed is:

1. A non-volatile memory comprising:

an insulating substrate having a first electrode extending through the substrate from the front surface to the rear surface thereof;

a second electrode formed on one side of the insulating substrate; and a recording layer that is clamped between the first electrode and the second electrode and whose resistance value varies when an electric pulse is applied across the first electrode and the second electrode;

the insulating substrate having a layered structure composed of an organic dielectric thin film and an inorganic dielectric layer that is thinner than the organic dielectric thin film, with the recording layer being formed on the side on which the inorganic dielectric layer is formed.

2. A non-volatile memory according to claim 1, wherein the first electrode is filled in a fine pore formed in the insulating substrate, and a heat-resistant protective film that is made of an inorganic dielectric is formed on at least one portion of the inner wall surface of the pore.

3. A non-volatile memory according to claim 2, wherein the heat-resistant protective film is continuously connected to the inorganic dielectric layer.

4. A non-volatile memory according to claim 1, wherein the thickness of the inorganic dielectric layer is not less than 2 nm but not more than 50 nm.

5. A non-volatile memory according to claim 1, wherein the organic dielectric thin film is made of polycarbonate and the inorganic dielectric layer is made of silicon oxide.

6. A non-volatile memory according to claim 1, wherein the recording layer comprises a phase-change material having at least two stable states with different resistance values and the capability of being reversibly switched between the states.

7. A non-volatile memory according to claim 6, wherein the phase-change material includes a chalcogenide based material.

8. A non-volatile memory according to claim 2, wherein the aspect ratio of the pore is not less than 1 but less than 10.

9. A non-volatile memory according to claim 8, wherein the heat-resistant protective film is formed on the entire inner wall surface of the pore with a uniform thickness.

10. A non-volatile memory according to claim 2, wherein the aspect ratio of the pore is not less than 10 but not more than 100.

11. The non-volatile memory according to claim 10, wherein the thickness of the heat-resistant protective film becomes less in the direction from the second electrode toward the first electrode inside the pore.

* * * * *